United States Patent [19]
Patterson et al.

[11] Patent Number: 5,213,715
[45] Date of Patent: May 25, 1993

[54] DIRECTIONALLY CONDUCTIVE POLYMER

[75] Inventors: Timothy P. Patterson, Costa Mesa; Carl E. Hoge, Encinitas, both of Calif.

[73] Assignee: Western Digital Corporation, Irvine, Calif.

[21] Appl. No.: 338,954

[22] Filed: Apr. 17, 1989

[51] Int. Cl.$^5$ .............................................. H01B 1/06
[52] U.S. Cl. .................................... 252/518; 252/511; 252/512
[58] Field of Search ........................ 252/511, 512, 518

[56] References Cited

U.S. PATENT DOCUMENTS

| | | | |
|---|---|---|---|
| 4,054,540 | 10/1977 | Michalchik | 252/512 |
| 4,604,303 | 8/1986 | Takakura et al. | 427/229 |
| 4,634,623 | 1/1987 | Watkins | 428/208 |
| 4,666,742 | 5/1987 | Takakura et al. | 427/229 |
| 4,731,282 | 3/1988 | Tsukagoshi et al. | 428/220 |
| 4,754,546 | 7/1988 | Lee et al. | 29/877 |
| 4,778,950 | 10/1988 | Lee et al. | 174/356 C |
| 4,790,968 | 12/1988 | Ohkawa et al. | 264/104 |
| 4,874,549 | 10/1989 | Michalchik | 252/511 |
| 5,084,211 | 1/1992 | Kawaguchi et al. | 252/511 |

Primary Examiner—Mark L. Bell
Assistant Examiner—Alan Wright
Attorney, Agent, or Firm—Christie, Parker & Hale

[57] ABSTRACT

A directionally conductive polymer (DCP) provides an electrical interconnect between terminal or conductors on a pair of electrical components. The DCP is applied in viscous film form to the interface between the two components. The DCP comprises a resinous matrix containing metal particles in an amount normally causing the film to act as an electrical insulator. Electrical conduction through the film is normally inhibited in an unstressed state. When a stress is applied to the film, the metal particles make contact to form a continuous electrical path through the film in alignment with the applied stress. The metal particles maintain electrical insulating properties in regions of the film not subjected to the applied stress. In one embodiment, the film includes a metal polymer dispersed in a dielectric carrier resin. A first resinous material dissolved in a solvent contains a dispersion of metal particles. The dielectric material comprises a second resinous material dissolved in the same solvent. The second resin in immiscible in the first resin so that application of a compressive force on the film during solvent evaporation reduces the solubility of the solvent in the first resin, causing a collapse of the film in the compressed region, thereby forming a metal-resin composite which is electrically conductive. The regions of the film remote from the compressed regions provide a dimensionally stable electrical insulator.

13 Claims, 7 Drawing Sheets

DIRECTIONALLY CONDUCTIVE POLYMER

FIELD OF THE INVENTION

This invention relates to techniques for forming interconnects between electrical components, and more particularly, to a directionally conductive polymer used for interconnecting various combinations of integrated circuit components.

BACKGROUND OF THE INVENTION

In the broadest sense, an electronic interconnect is any medium which provides a path for the flow of electrons from one electrical component to another. Interconnects vary widely in their use and function. Often, they provide mechanical strength and a means for heat dissipation as well as electrical conductivity. For example, thin gold or aluminum wires are commonly used to connect integrated circuit (IC) chips to leadframes or substrates. Such interconnects act merely to provide an electrical path to and from the silicon. Solder joints, on the other hand, provide mechanical adhesion of surface mount packagas to boards or substrates in addition to functioning as electrical conduits. Further, die attach media can be configured to act as paths for heat flow as well as providing electrical connection and mechanical adhesion between the back side of the chip and the package or substrate.

With the advent of Surface Mount Technology (SMT), fine pitch packages (25 mil pitch) and items such as Tape-Pak (trademark of Intel Corporation) and Multistrate Module have placed increasingly stringent requirements upon interconnect media. Conventional screen printed solder lands have beer successfully used for surface mounting of plastic leaded chip carriers (PLCC's), available in 50 mil center packages, for example. However, extension of the basic technology to surface mount of 25 mil center (fine pitch) packages has been unsatisfactory. Significant rework efforts are necessary to remove solder bridges between leads and opens between package leads and solder lands following the IR solder flow process.

Currently, polymeric materials filled with metal powders are being investigated as alternatives to conventional soldering techniques. These materials include traditional filled epoxy composites as well as newer systems based on solvent soluble, thermoplastic resins. Filled organics offer the advantage over solder in that they maintain higher viscosities during the bonding process. This feature allows the organic interconnect to maintain its as-screened shape more readily than solders which liquify completely during reflow.

Thus, the prior art has provides a number of techniques for forming electrical interconnects, but all have limitations or disadvantages.

SUMMARY OF THE INVENTION

Briefly, this invention provides a directionally conductive polymer for forming an electrical interconnect between electrical components, including various combinations of integrated circuit components. The directionally conductive polymer is applied as a viscous film between a first electrical component and a second electrical component. The directionally conductive polymer film comprises a resinous matrix containing metal particles in an amount which normally causes the film to act as an electrical insulator. The metal particles are surface-treated so that electrical conduction through the depth of the film is normally prevented when the film is in an unstressed state. When a stress is applied to the film, it causes the metal particles in the film to make metal-to-metal contact and thereby form a continuous electrical path through the film in alignment with the direction of the applied stress. This provides an electrical interconnect between the first and second components. The surface-treated metal particles contained in the resinous matrix continue to act as an electrical insulator in regions of the film not subjected to the applied stress. Various forms of surface-treatment of the metal particles are disclosed herein. Generally, these surface-treatment techniques allow the film to be filled with metal particles to a sufficient level which enhances conduction in response to the applied stress, while maintaining electrical insulating properties in the unstressed areas of the film.

In one embodiment of the invention, the metal particles are surface-treated to form discrete globules of an electrically conductive metal polymer material dispersed in a viscous dielectric carrier material. The globules each comprise a first resinous material dissolved in a solvent and providing a binder for a dispersion of metal particles. The dielectric carrier material comprises a second resinous material dissolved in the solvent. The directionally conductive film provides an interface to bond the first electrical component to the second electrical component upon solvent evaporation from the film. The second resinous material is immiscible in or sparingly soluble in the first resinous material, and the solvent has a partial molar volume which is positive when forming a solution with the first resinous material. As a result, selective application of a compressive force on the film in the region between the electrical components, during solvent evaporation, causes a collapse of the film in the compressed region. This forms a metal-resin composite which is electrically conductive to provide localized electrical conductivity between the first and second electrical components in the compressed region. Regions of the film remote from the compressed region(s) remain stable dimensionally and provide an electrical insulator at the interface between the first and second electrical conductors.

In another embodiment of the invention, the directionally conductive polymer may comprise a one-resin system together with use of a surfactant which contacts the surfaces of the metal particles. The surfactant can comprise a surface charge surfactant, or a surfactant which induces wetting of the metal surfaces by the resin. The surfactant which arts a wetting agent also can be used with a two-resin system. These surfactant systems can provide an effective means for preventing coalescence or random conduction in unstressed regions of the directionally conductive polymer, where the film is intended to serve as an electrical insulator.

The directionally conductive polymer provides a versatile means of interconnecting electrical components. The polymer can simply be applied at the interface between the electrical components, either by screening it on, painting, or by roller techniques, for example. Pressure and heat then may be applied in one step to bond the two components while at the same time selectively forming the interconnect regions between the electrical components. The film maintains its viscosity during this bonding process.

The directionally conductive polymer is adaptable for forming interconnects between various electrical circuit components, including, but not limited to, connection of IC chips to leadframes, spreaders, chip carriers, or substrates such as circuit boards; connection of IC chip carriers, leadframes or spreaders to substrates such as circuit boards or housings; and connection of contacts on one substrate to contacts on another substrate.

These and other aspects of the invention will be more fully understood by referring to the following detailed description and the accompanying drawings.

DETAILED DESCRIPTION

Figure 1:
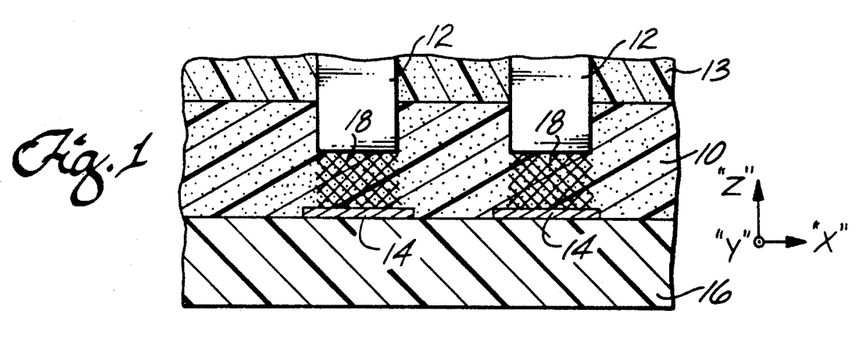
FIG. 1 is a schematic cross-sectional illustration representing a surface mount integrated circuit package connected to a circuit board by a directionally conductive polymer according to principles of this invention.

FIG. 1 schematically illustrates an electrical interconnect medium 10 according to principles of this invention. The interconnect medium provides electrical interconnects between electrical conductors or terminals on various combinations of electrical components described in more detail below. The illustration in FIG. 1 depicts the interconnect medium 10 electrically connecting leads 12 on a surface mount package 13 to lands 14 on a circuit board or substrate 16. The medium 10 conducts electricity only in the regions (represented by the cross-hatched areas 18) where the leads 12 on the package 13 are aligned with the lands 14 on the board. No electrical path exists between the leads 12 themselves or between the lands 14. Electricity is conducted in one direction only, i.e., between each lead and its corresponding land.

The electrical interconnect medium which contains metal particles becomes electrically conductive only in regions where a compressive stress is applied to the interconnect material. In stress-free or tensile regions (the regions away from the areas 18), no electrical conduction occurs. Therefore, in the embodiment of FIG. 1, electrical conduction proceeds in the "z" direction, but not in the "x" or "y" directions.

Figure 2:
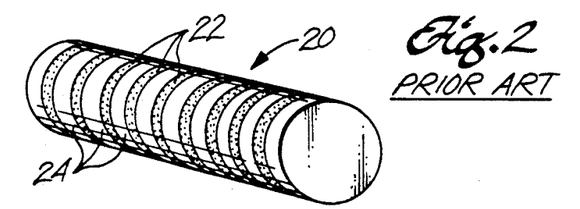
FIG. 2 is a schematic perspective view illustrating a prior art electrical connector.

The present invention will be better understood by first referring to the prior art electrical connectors illustrated in FIGS. 2 through 5. FIG. 2 illustrates the basic geometry of a prior art "Zebra" connector 20. This form of interconnect provides a sandwich structure of alternating electrically conductive layers 22 and electrically insulating layers 24 formed in a cylindrical shape. Typically, metal is plated onto a compliant polymer, or the polymer is filled with a medium such as graphite to control the desired electrical properties. The insulating regions consist of the same polymer in the unfilled or unplated form. Contact between electrical components is achieved by mechanical interference, thus necessitating the presence of some form of clip or clamp to hold the "Zebra" connector in place.

Figure 3:
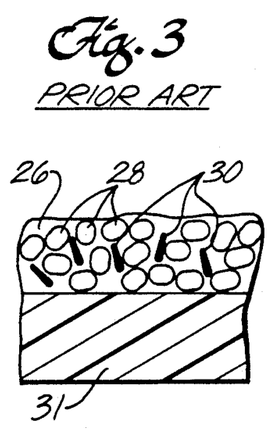
FIGS. 3 through 5 are schematic cross-sectional views illustrating use of an alternative prior art connector.
Figure 4:
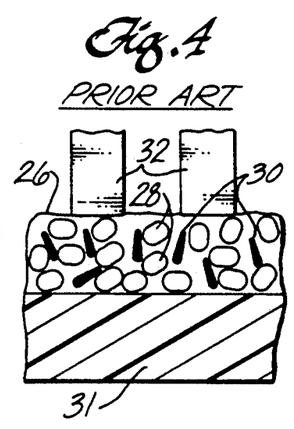
Figure 5:
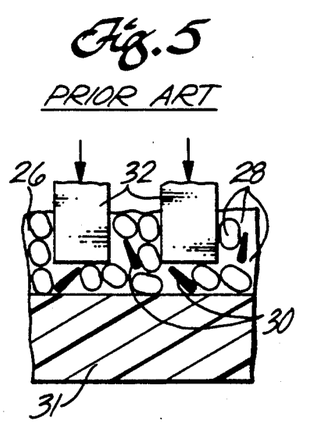

FIGS. 3 through 5 illustrate a recently developed polymeric interconnect medium 26 known as the Uniax polymer which is reported to have selective "z"-axis conduction. As illustrated in FIG. 3, the medium consists of a polymer which is filled with two types of inorganic particles. The Uniax material contains a carbonate-type mineral filler 28 and nickel flakes 30. To interconnect two electrical components, as depicted in FIG. 4, the polymer 26 is placed over the conductive traces of one of the components 31. The leads 32 on the other component are then aligned and embedded into the polymer. Some form of clamp or other external force is then applied to generate compressive stresses, represented in FIG. 5, in the regions between the desired interconnects. Depending upon the nature of the polymer, temperature or ultraviolet radiation is applied to produce adhesion between the interfaces. During the clamping and curing process, the interconnect medium is deformed at locations experiencing the compressive stresses. As the leads are forced into the polymer film, excess polymer and carbonate particles are forced to flow laterally away from the compression zone, while minimizing the flow of nickel particles away from the contact region.

Scanning electron microscope micrographs of a polished cross-section of two electronic structures connected with the Uniax material have been observed. The nickel particles and carbonate-type dielectrics have been identified in these micrographs. This form of electrical interconnect relies on the statistical probability that nickel particles are present in sufficient numbers in the compressed zone to enhance conductivity. The thickness of the interconnect is determined by the largest nickel particle present in the compressive region. Judging from the microstructure depicted in the micrographs, the preponderance of nickel in the compressed zone is quite small. It appears that electrical contact is made at isolated points rather than over a broad area. This feature of the Uniax process can present potential electrical problems in the form of high resistance and the possibility that mechanical cycling could dislodge electrical contact points.

The present invention provides a directionally conductive polymer which can be applied as a viscous film to in interface between a pair of electrical components to be connected. The directionally conductive polymer film generally comprises a resinous matrix filled with metal particles. In an unstressed state the film acts as an electrical insulator. When stress or a compressive force is applied directionally to the film, an electrically conductive path is formed by the metal particles contacting one another through the depth of the film, in alignment with the direction of the applied stress. The remaining unstressed areas of the film are maintained as an electrical insulator. The invention provides techniques for surface-treating the metal particles contained in the resin so that the amount of metal particles contained in the film can be increased to a level which insures good electrical contact under an applied stress, while the surface-treatment of such a highly filled resin continues to inhibit electrical conduction in areas of the film which remain unstressed.

Surface-treatment of the metal particles can comprise applying a coating material to the surface of the metal particles individually; or groups of metal particles can be contained in a binding material and dispersed in the dielectric resin component of the film. The surface-treatment material and binding material in increase the amount of metal particles that can be contained in the dielectric film when compared with a film containing metal particles which are not surface-treated. The surface-treatment material acts within the dielectric film resin to inhibit electrical conduction through the film by normally avoiding metal-to-metal contact of the metal particles in an unstressed state of the film. This surface coating or binding material thereby allows a greater amount of metal particles to be used in the film while still inhibiting electrical conduction, and as a result of the greater level of filling of metal particles in a film, more reliable metal-to-metal contact through the film is produced in response to an applied stress.

Figure 6:
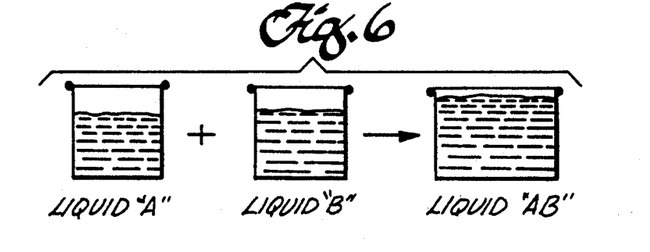
FIG. 6 schematically illustrates mixing of two mutually insoluble liquids and the resulting liquid volumes depending upon properties of the liquids being mixed.

Before describing one embodiment of the present invention, it will be informative to review some basic chemical principles applicable to this invention. FIG. 6 depicts a simple experiment in which two mutually soluble liquids, "A" and "B", are mixed to form a third liquid, "AB", i.e., ("A"+"B"="AB"). The experiment itself consists of precisely measuring the volumes of "A" and "B" and the "AB" mixture. There are three possible outcomes to the experiment:
(1) VAB=VA+VB
(2) VAB<VA+VB
(3) VAB>VA+VB Outcome (1) signifies ideal mixing. From a chemical bonding viewpoint, "A" and "B" are unaware of the other's existence. Outcome (2) reveals that when the two are mixed together, the resulting volume is less than that of the two separate liquids. Finally, in outcome (3) the resulting volume is actually larger than the sum of "A" and "B". The latter two outcomes occur when some type of chemical interaction has occurred between "A" and "B" atoms during the mixing process.

Figure 7:
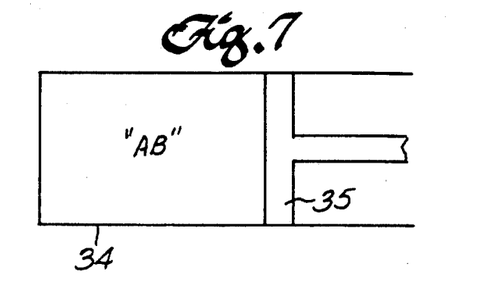
FIGS. 7 and 8 schematically illustrate compression of a liquid having a positive partial molar volume.
Figure 8:
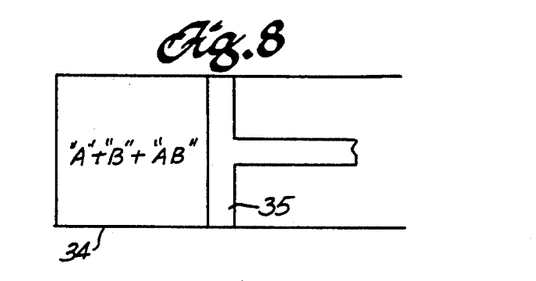

FIGS. 7 and 8 illustrate liquid "AB" as having the properties of outcome (3) and being contained in a vessel 34 having a piston 35 which can apply a compression force on the liquid. In FIG. 7, the liquid "AB" is not compressed. In FIG. 8, the liquid "AB" is compressed by force applied to it by the piston.

The Principle of Le Chatelier states, in its simplest form, that any external disturbance applied to a system that is at equilibrium results in an action which tends to restore the equilibrium. In this context, consider the effect of pressure on the liquid depicted in FIG. 8. Pressure acts to reduce the volume of the liquid. Since the normal volume of the "AB" liquid is greater than that of the two separate liquids, the system can react to the external disturbance by having some of the "AB" liquid separate into "A" and "B" liquids. That is, the reversible reaction $$\text{"A"} + \text{"B"} = \text{"AB"} \tag{a}$$

shifts to the left under the influence of applied pressure. The net effect is a reduction in the total volume of the system in response to the application of an external pressure. This concept can also be defined in terms of partial molar quantities:

$$\overline{v} = (V/n_1) \tag{b}$$

where
$\overline{v}_1$ = partial molar volume
$V$ = molar volume
$n_1$ = amount of component (a)

Equation (b) describes the effect of the addition of a small amount of component (a) on the incremental volume change of a solution. Since $$\frac{\ln (f_1)}{P} T, x = \frac{\overline{v}_1}{RT} \tag{c}$$

where
$f_1$ = fugacity of component ,a)
$P$ = pressure
$R$ = gas constant
$T$ = absolute temperature,
equation (c) reveals that if $\overline{v}_1$, the partial molar volume, is positive (outcome 3), the fugacity, or escaping tendency, increases with increasing pressure. An increase in fugacity with pressure, therefore, signifies that equilibrium has been disturbed. In order to reduce the fugacity to accommodate the pressure increase, reaction (a) must shift to the left.

Similar changes in fugacity of solvent-soluble polymeric materials occur as temperature increases occur toward the boiling point of the solvent. Therefore, both pressure and temperature can act to exhaust solvent from a solvated polymer-metal powder composite, as described in more detail below.

Figure 9:
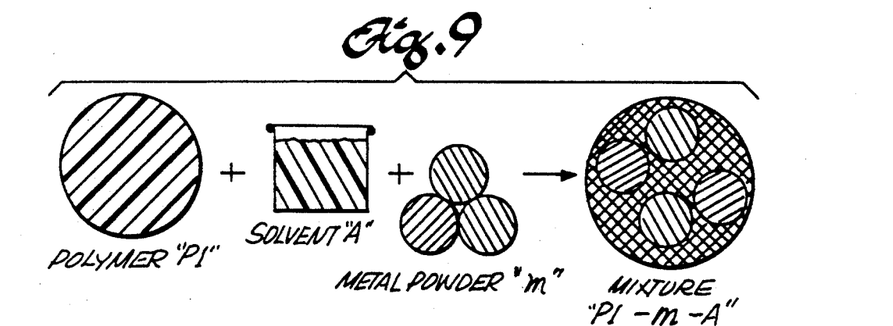
FIG. 9 is a schematic cross-sectional illustration representing an electrically conductive resinous component of the directionally conductive polymer of this invention.

Techniques for achieving selective electrical conductivity, according to one embodiment of this invention, will now be described. This form of the directionally conductive polymer system contains two different polymers, "P1" and "P2", plus a metal powder "m" and a solvent "A". "P1" is a resin which is soluble in solvent "A". The solvent is selected so that the partial molar volume when forming a solution with resin "P1" is positive. Thus, a chemical interaction occurs between the atoms in resin "P1" and solvent "A" in the mixing process. The resin "P1" and solvent "A" are mixed with the metal powder "m" as represented in FIG. 9. The resultant mixture is a metal polymer identified herein as the "P1-m-A" polymer. Resin "P2" is selected to be immiscible or only sparingly soluble in resin "P1". However, resin "P2" is chosen to possess at least limited mutual solubility with solvent "A". The resultant mixture of resin "P2" dissolved in solvent "A" is identified herein as the "P2-A" polymer.

Figure 10:
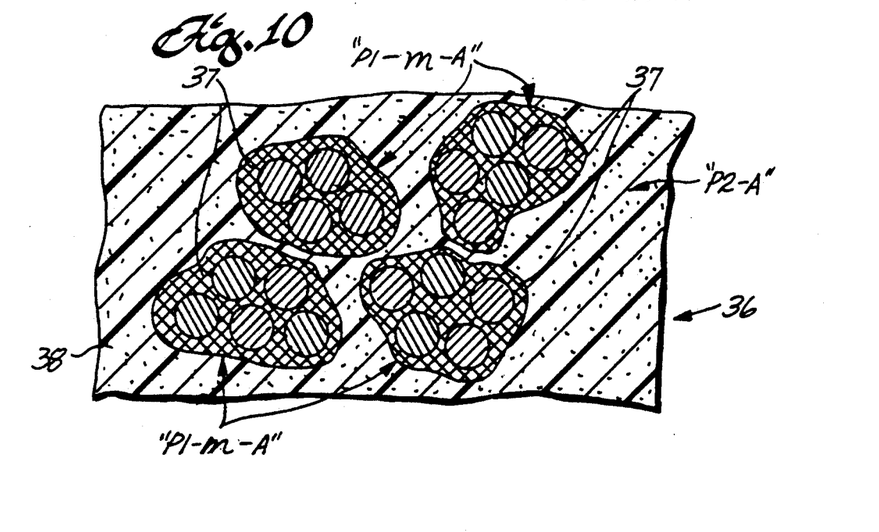
FIG. 10 is a schematic cross-sectional illustration representing an electrically conductive component of the directionally conductive polymer dispersed in a dielectric carrier film.

The directionally conductive polymer system comprises a viscous liquid material in which the "P1-m-A" polymer is mixed with the "P2-A" polymer to form a dispersion of the "P1-m-A" polymer in the "P2-A" polymer. The resulting composite material 36 is schematically illustrated in FIG. 10. The "P1-m-A" polymer is mixed with the "P2-A" polymer to form a composite consisting of regions containing globules or islands 37 of metal-rich polymer ("P1-m-A") dispersed in and surrounded by a viscous carrier 38 ("P2-A") of metal-free resin. The metal powder is selected to range in particle size from sub-micron to several microns in diameter. Thus, the islands 37 can be controlled to vary in size anywhere from about one to about twenty microns. It is expected that the effective viscosity of the "P1-m-A" polymer will be somewhat greater than that of the "P2-A" polymer. The metal particles contained in the "P2-A" polymer are considered to be "surface-treated" by the "P1-A" polymer, as will be more fully described below.

Figure 11:
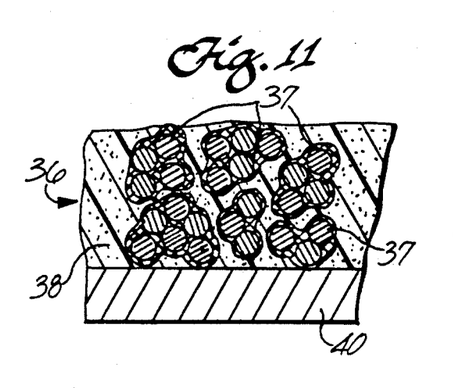
FIGS. 11 through 14 are schematic cross-sectional representations of a sequence for forming an electrical interconnect with the directionally conductive polymer of this invention.
Figure 12:
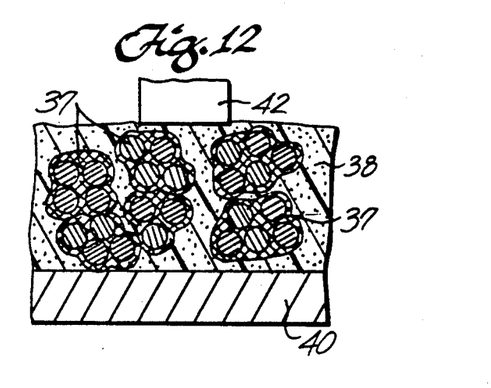
Figure 13:
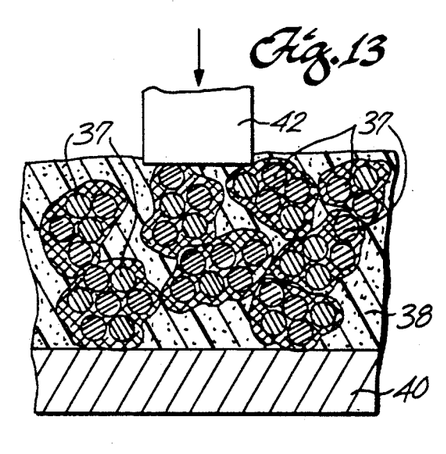
Figure 14:
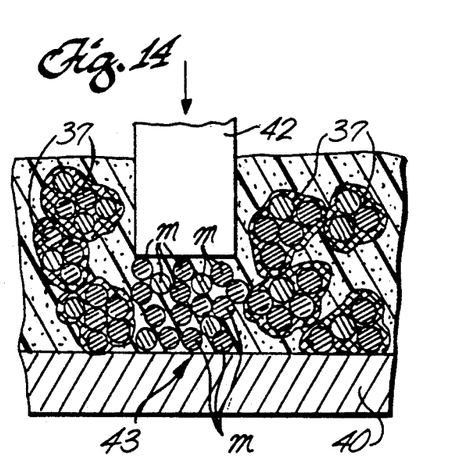

FIGS. 11 through 14 illustrate the sequence of interconnecting electrical components using the directionally conductive polymer. In FIG. 11, the directionally conductive polymer composite material 36 is deposited in film form above an electrical land 40 on a first electrical component. In FIG. 12 a component lead 42 of a second electrical component is aligned over the land 40. A normal force is applied to the second component which imparts a compressive stress on the directionally conductive polymer film in the region between the lead 42 and the land 40, as shown in FIG. 13. A combination of time and temperature results in solvent removal as depicted in FIG. 14.

The system functions as follows:

(1) Heat is applied to the film to drive out the solvent and thereby mechanically bond the contacting portions of the electrical components at the interface between the film and the components. During solvent removal, pressure is applied selectively to the regions where the electrical interconnects are to be formed. The terminals on at least one of the components must be non-planar (relative to the body of the component) so that the terminals can project from the body of the component and be embedded in the film, in alignment with a corresponding terminal or conductor on the other component. The compressive stress placed upon each interconnect region causes the solubility of the solvent "A" in the globules of the "P1-m-A" resin to be reduced.

(2) The solvent separates from the "P1-m-A" resin and is extruded into and absorbed by the "P2-A" resin which becomes less viscous due to the solvent absorption. Continued application of heat removes the solvent from the film and produces bonding. The "P2" resin acts as a vehicle to get the solvent out of the film during solvent evaporation. The "P2" resin remains dimensionally stable during solvent removal to produce a generally uniform "P2" resin film interface between the surfaces of the components.

(3) Removal of the solvent from "P1-m-A" resin results in a contraction or collapse in each of the compressed regions, as illustrated at 43 in FIG. 14. This collapse is produced because the solvent "A" when forming a solution with the resin "P1" has a partial molar volume which is positive.

Figure 15:
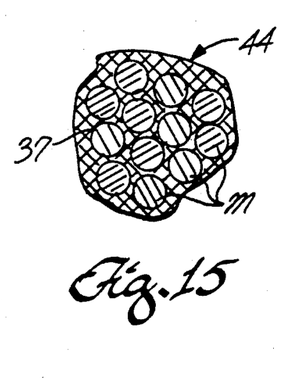
FIGS. 15 through 17 are schematic cross-sectional illustrations representing how the electrically conductive component of the directionally conductive polymer has coalesced to form a metal-resin composite.
Figure 16:
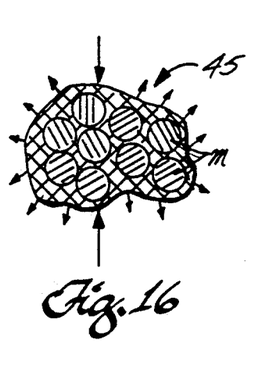
Figure 17:
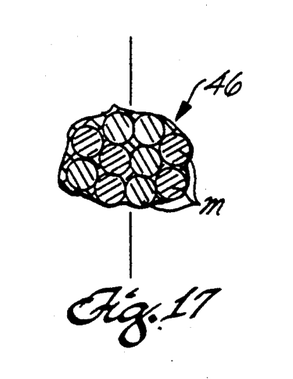

(4) The final configuration, illustrated in FIGS. 15 through 17, depicts how the islands 37 have coalesced to form a metal-resin composite which is electrically conductive in each region 43 where the compressive force has been applied. FIG. 15 illustrates a stress-free composite 44. FIG. 16 illustrates extrusion of the solvent "A" from the "P1-m-A" composite 45 when compressive stress is applied during solvent removal. FIG. 17 depicts the composite 46 in its final configuration with all solvent essentially removed. Upon solvent removal, the metal-resin composite rigidly bonds the terminal of one component to the terminal of the other component in alignment with the applied pressure. The metal-resin composite provides electrical contact (metal touching metal) over a broad area in which there is a large concentration of contacting metal particles "m" in the compressed region. The regions away from the compressed regions which are not electrically conductive also contain dispersed metal islands 37 which are surrounded by the rigid "P2-A" resin composite which is an electrical insulator.

The metal particles "m" contained in the "P2-A" polymer are surface-treated by the "P1-A" polymer to normally maintain the composite film as an electrical insulator. The surface-treatment of the metal particles by the "P1-A" polymer resists any tendency for the metal contained in the "P2-A" resin to form random conductive paths through the film, even where the film is filled with metal to a reasonably high level. For instance, the invention permits loading of the composite with metal particles to a higher level, while still preventing random conduction, when compared with untreated metal particles contained in the same resinous film. The higher level of metal contained in the film enhances conduction when a directional stress is applied.

Thus, the present invention provides a directionally conductive viscous liquid material which can simply be applied as a film to the interface between a pair of electrical components to connected. The interconnect film can be applied as a paste by painting on or rolling on the surface, or it can be applied by screening techniques, for example. The film is preferably applied to the entire surface area, after which heat and pressure are applied to produce solvent evaporation and the compressive force necessary to form the mechanical bond and the conductive interconnects. As an alternative, other means of solvent removal can be used such as drying in air or by application of a vacuum.

The invention avoids customized interconnects in which mechanical structures in the interconnect are physically arranged to match a particular pattern. As lead pitch configurations become smaller and smaller, such interconnects become more difficult to produce reliably. With the present invention, pressure is simply applied selectively at the locations where the interconnects are desired.

The invention provides an assembly technique which allows connection of high lead count packages to substrates. The invention has great flexibility in the types of electrical components that can be interconnected, including both active and passive devices.

The invention also can be used for interconnecting a variety of components including bonding an IC chip carrier to a planar substrate such as a printed circuit board, to a three-dimensional substrate, a flex circuit, or a housing.

Several types of materials are possible for use. The "P1" material can be a silicone, polyamide, polyamidimide, an epoxy, or a thermoplastic resin. The metal powder can range from gold to non-noble metals such as nickel or copper, depending upon the application. The "P2" resin can be an epoxy, a silicone, polyamide, polyamidimide, or a thermoplastic resin. Particular solvents can be selected to be compatible with the starting polymers and can include methylethylketone, N-methyl pyrrolidone, or diglyme.

An example of a polymer composite system can include a siloxane polyamide such as M&T 2065 as the "P1" polymer. The solvent for this material is diglyme. Combining the siloxane with the diglyme and a metal powder such as nickel or copper results in a configuration such as that depicted in FIG. 9. Either pressure and/or heat will cause the solvent to be exhausted from the resin system. The "P2" polymer can consist of an epoxide resin having limited solubility in the diglyme solvent system.

Another possible system consists of an epoxy resin as the "P1" material, with methylethylketone as the solvent, and silver or palladium-silver as the metal powder. The "P2" resin can be a siloxane polyamide.

As described previously, the directionally conductive polymer can be in the form of a paste composed of two polymer resins having differing degrees of solubilities of a common solvent. One resin contains metal powders which act as conduction paths for both electricity and heat. In the uncured form, this resin-metal composite acts as the filler phase. The second polymer resin forms the continuous matrix phase that encases the resin-metal composite. Under the application of external pressure in the form of a mechanical stress on the surface of the film, the composite system is distorted so that the matrix phase flows away from the region of the filler phase, thus compressing regions of filled resin. Continued application of the stress results in the dissolution of solvent from the resin-metal system into the matrix phase. This latter step will occur if the partial molar volume of the solvent in the resin in positive. The net effect is to force the metal particles into direct contact. This process continues until sufficient metal contacts are formed to sustain the external load. Final curing causes the system to harden and therefore maintain the desired geometry.

This approach for directionally conductive polymers is advantageous since it does not require an "underfilled" metal system. Also, numerous types of resin-solvent systems can be developed for specific applications.

This invention also includes an alternative approach for fabricating a directionally conductive polymer using a one-resin system based on the incorporation of a surfactant onto the surface of the metal particles. Two types of surfactants can be used. One consists of a polymer which can induce a net electrostatic charge on the surface of the metal powder. The other enhances wetting of the metal by the resin.

In a first approach, the surface charge surfactant consists of a long chained polymeric molecule having a group at one end which adheres well to the metal and a group at the other end which is highly polarizable and therefore can cause the metal particles to have an effective surface charge.

In lightly filled systems having resins with sufficient viscosity to inhibit sedimentation, light loading or "underfilling" causes poor electrical conduction. However, as the loading increases, conductivity increases until the entire composite becomes electrically conductive in any direction. The purpose of the surfactant is to provide loadings approaching the maximum limit while maintaining electrical insulation in any areas not subjected to an external compressing stress.

Figure 18:
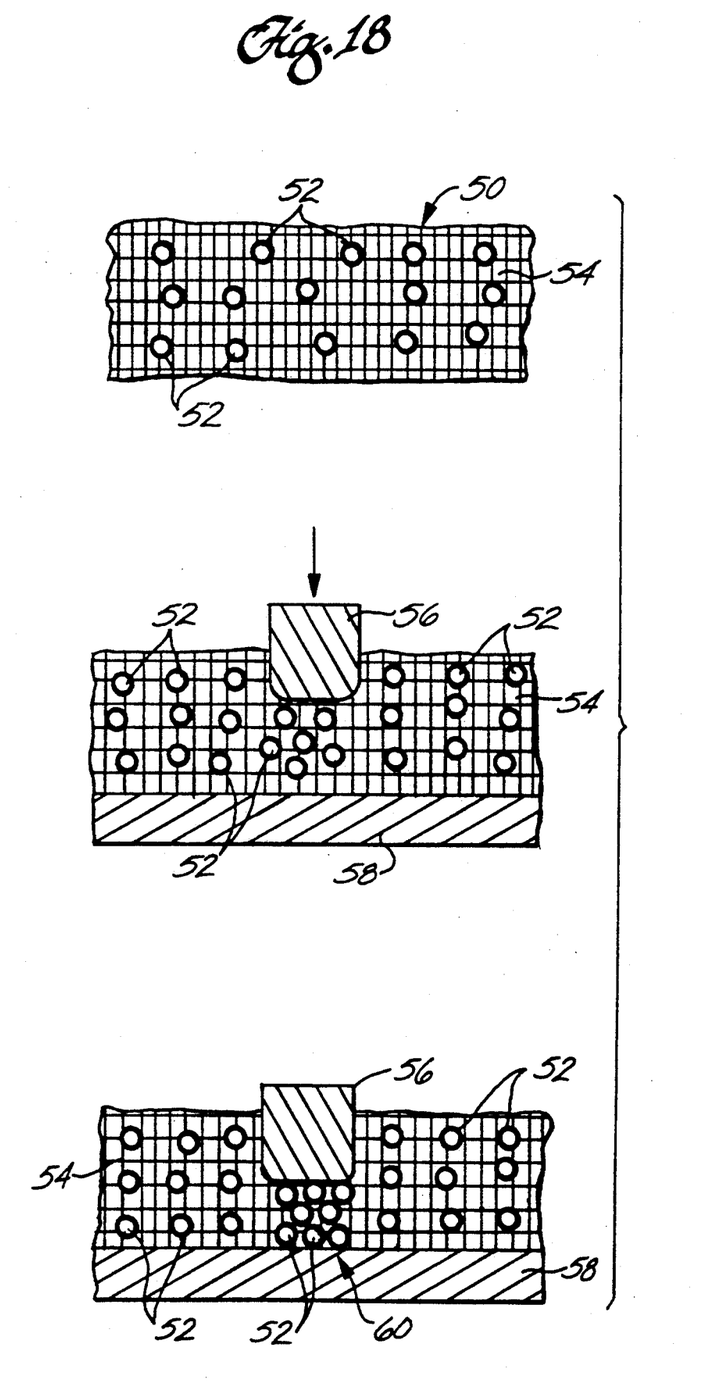
FIG. 18 schematically illustrates a sequence of bonding a pair of electrical components using a directionally conductive polymer containing a surface charge surfactant.

As loading increases, metal powders tend to decrease the spacing between them. However, if the powders contain a net charge, they will tend to repel each other as surface tension causes their approach. Thus, loading levels can be achieved which would cause electrical shorting in the absence of the surfactants. FIG. 18 depicts this process in a sequence of bonding a pair of electrical conductors using a composite directionally conductive polymer film 50. The composite is made from a mixture comprising surfacted metal particles 52 present as a filler in a resin matrix 54. The metal particles are coated with a surface charge surfactant. The single-resin system containing the surfacted metal particles 52 is deposited as a film above an electrical land 58 of a first electrical component. A component lead 56 of the second electrical component is aligned over the land 58. A compressive force is applied to the second component to impart a compressive stress on the film in the region between the lead and the land. A combination of time and temperature results in solvent removal and produces the completed electrical contact at 60, where the surfacted metal particles have mutual contact between each other to provide a continuous electrical path over a wide area between the lead and the land.

Figure 19:
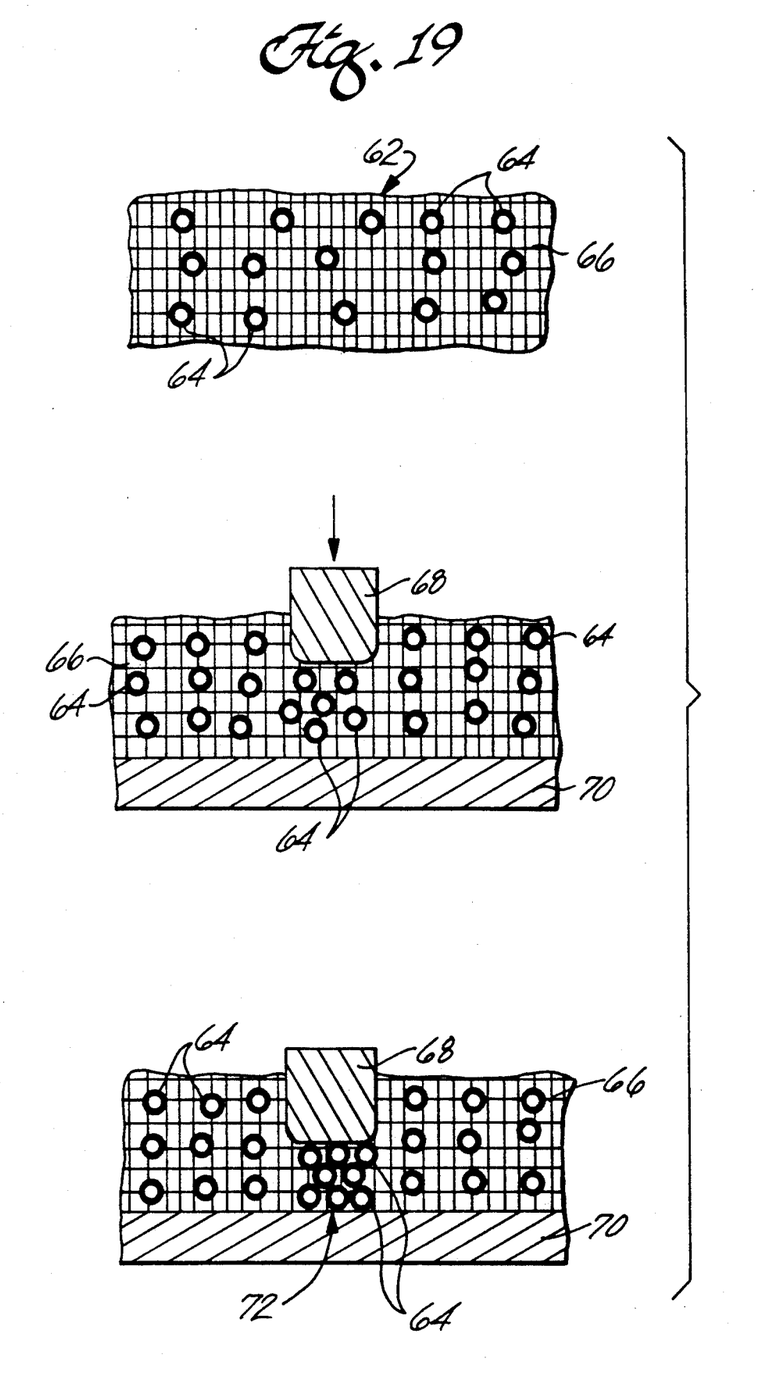
FIG. 19 schematically illustrates a sequence of bonding a pair of electrical components using a directionally conductive polymer comprising a surfaced metal powder in a single-resin system.

The second approach involves incorporating a surfactant onto the surface of the metal, which causes the matrix resin to spontaneously spread over the surface of the particles. In this instance, the loading is expected to be somewhat less than for the electrostatic example. Filler particles are prevented from coalescing into agglomerates and therefore forming randomly conductive paths by the flow of resin between the particles under the action of surface tension (i.e., the solid-liquid dihedral angle is less than zero). FIG. 19 depicts this process in a sequence of bonding a pair of electrical conductors using a composite directionally conductive polymer film 62. The composite is made from surfacted metal particles 64 present as a filler in a resin matrix 66. The metal particles are coated with a surfactant which acts as a wetting agent for the surface of the metal particles. This single-resin system containing the surfacted metal particles 64 is deposited as a film above an electrical land 70 of the first electrical component. A component lead 68 of a second electrical component is aligned over the land and the compressive force is applied to the second component to applied a compressive stress on the film in the region 72 between the lead and the land. Electrical contact is produced between the contacting metal particles in the compressed region 72.

Figure 20:
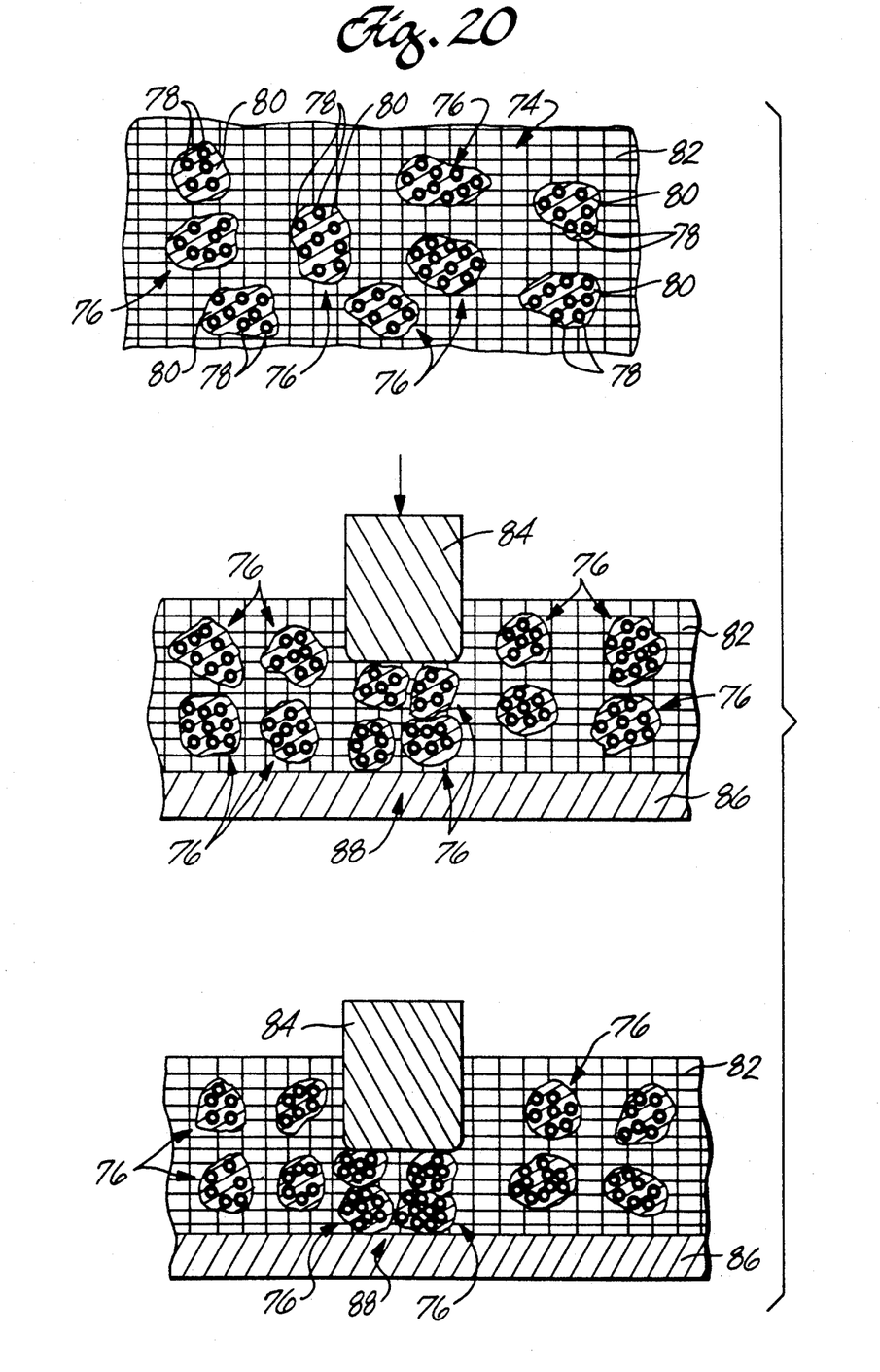
FIG. 20 schematically illustrates a sequence of bonding a pair of electrical conductors using a directionally conductive polymer comprising a surfaced metal powder in a two-resin system.

Referring to FIG. 20, a two-resin approach involves generating a metal-resin system having a surfactant which causes the metal to preferentially concentrate in the filler resin. This approach is similar to metal powders concentrating in air bubbles in a froth or foam system. This system, illustrated by the composite 74, is fabricated by mixing surfacted metal powders 78 in a filler resin 80 to form a very highly filled system. Such a system can approach the filler loading of spontaneously conductive epoxy systems. A second resin 82 which acts as the matrix phase is sparingly soluble in the first resin 80 and does not have an appreciable affinity for the surfacted metal powders 78. It is incorporated into the former to a level which results in a continuous coating of the resin-metal, filled material. This system comprises the metal-resin globules 76 dispersed in the resin matrix 82. FIG. 20 illustrates the process of using the composite 74 as a directionally conductive polymer for interconnecting a electrical lead 84 with an electrical land 86. Upon application of an external stress at the region 88, the matrix resin 82 is extruded from the space between the metal-resin globules until the load from the applied stress is maintained by the metal particles. Curing is then produced to harden the system into the desired geometrical shape.

Figure 21:
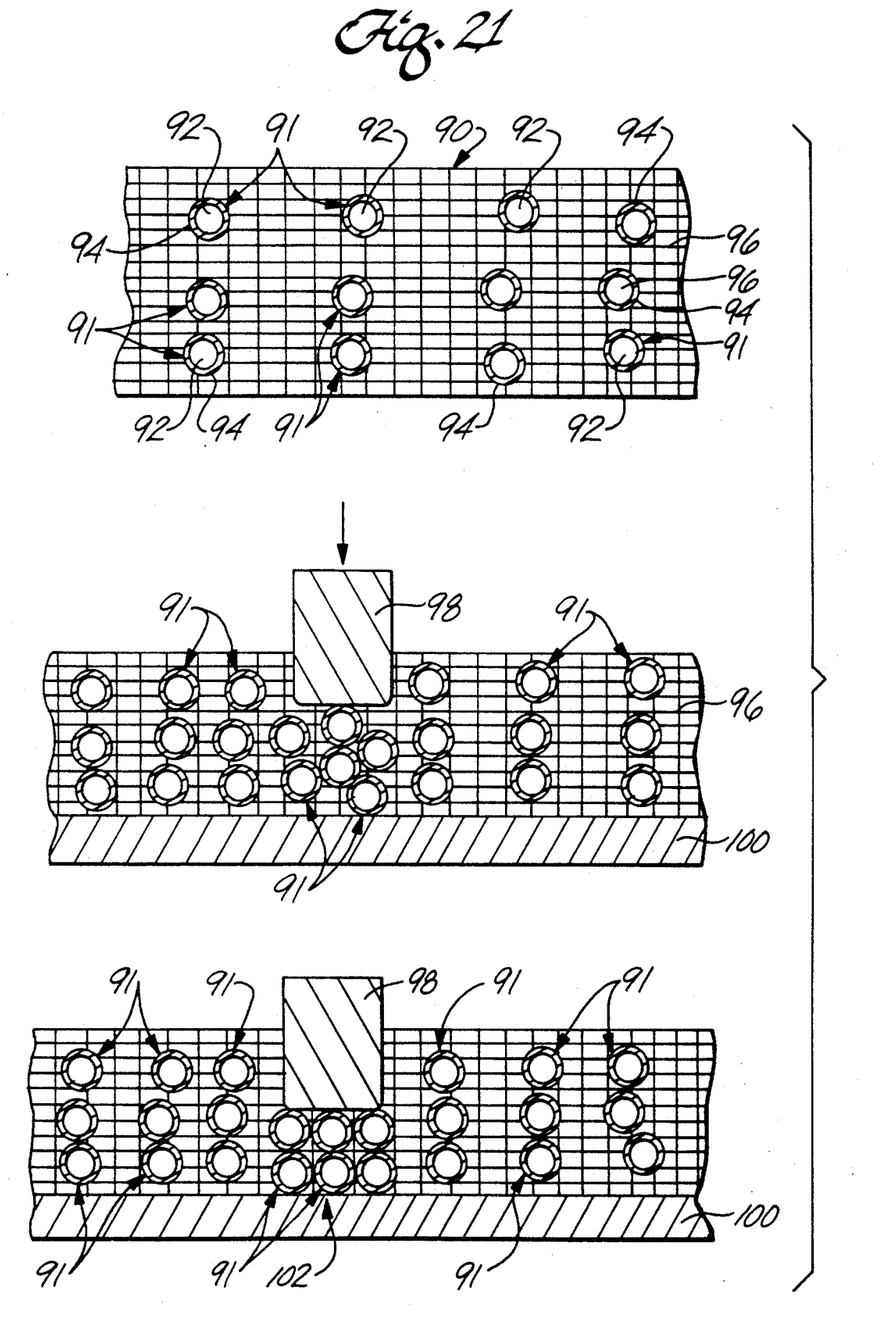
FIG. 21 schematically illustrates a sequence of bonding a pair of electrical components using a directionally conductive polymer providing preferential dissolution by a surfactant.

FIG. 21 illustrates a further approach in which the resin system 90 consists of a solution or alloy of two different polymer molecules. Surfacted metal powders 92 are mixed into the resin to the desired level which is somewhat less than the limit for electrical insulation. Upon mixing, the surfactant preferentially draws out and bonds to resin component 94 from the polymer alloy, thus forming a coating around each particle. The resulting particles 91 remain dispersed in a matrix of the other resin 96. In the unstressed state, this coating prevents coalescence and random conduction. When components 98 and 100 are interconnected by the film, by application of a compressive stress, the particles 91 are forced together, thus displacing resin 94 back into the solution while forming a continuous electrical path.

What is claimed is:

1. A directionally conductive polymeric material in film form for interconnecting a first electrical component and a second electrical component, the directionally conductive polymeric material comprising discrete globules of a conductive resinous material dispersed in a viscous carrier of a dielectric resinous material, the globules comprising a first resinous material dissolved in an organic solvent and containing a dispersion of metal particles, the first resinous material being selected from the group consisting of silicone, polyamide, polyamidimide, epoxy, and thermoplastic resins, the dielectric material comprising a second resinous material dissolved in an organic solvent, the second resinous material being selected from the group consisting of silicone, polyamide, polyamidimide, epoxy, and thermoplastic resins, and organic solvent being selected from the group consisting of methylethylketone, N-methyl pyrrolidone, and diglyme, the directionally conductive polymeric material in said film from providing an interface for bonding the first electrical component to the second electrical component upon solvent evaporation from the directionally conductive polymeric material, the second resinous material being immiscible in the first resinous material sufficient that selective application of a compressive force on the directionally conductive material in a region between said electrical components, during said solvent evaporation, causes the solubility of the solvent in the globules to be reduced, thereby resulting in a collapse of the directionally conductive material in the compressed region to form a metal-resin composite which is electrically conductive between the first and second electrical component in said compressed region, said interface having regions of the directionally conductive polymeric material remote from the compressed region provided electrical insulation between the first and the second electrical conductors.

2. A directionally conductive polymeric film according to claim 1 in which the solvent, when forming a solution with the first resinous material, has a partial molar volume which is positive.

3. A directionally conductive polymeric film according to claim 1 in which a chemical reaction occurs between the first resinous material and its solvent under the application of external heat.

4. A directionally conductive polymeric material comprising a viscous film for providing an interface between a pair of electrical components, said viscous film comprising discrete globules of an electrically conductive resinous material dispersed in a carrier comprising a dielectric resinous material, the globules including a solvated first resinous material, the first resinous material being selected from the group consisting of silicone, polyamide, polyamidimide, epoxy, and thermoplastic resins, the carrier including a solvated second resinous material selected from the group consisting of silicone, polyamide, polyamidimide, epoxy and thermoplastic resins the second resinous material being immiscible in the first resinous material, the first resinous material containing an organic solvent having a positive partial molar volume in the first resinous material, in which said film applied as an interface between said electrical components bonds the components upon solvent evaporation from the film, and in which a compressive force applied directionally through the film causes the globules of the electrically conductive resin dispersed in the carrier to increase electrical conductivity directionally along a path through the film where said compressive force is applied to selectively produce a continuous electrically conductive path through the film and thereby interconnect said electrical components.

5. A directionally conductive polymeric material for providing an electrical interface between a pair of electrical components, comprising a viscous film including discrete globules of a first resinous material containing metal particles, said globules being dispersed within a carrier comprising a second resinous material, the first and second resinous materials each being selected from the group consisting of silicone, polyamide, polyamidimide, epoxy and thermoplastic resins, the film normally being an electrical insulator which becomes electrically conductive along a path through the film where a compressive force being applied selectively to said film, the first resinous material being immiscible in the second resinous materials so that, in response to said applied compressive force, the metal particles contained in the globules collapse or coalesce along the path through the film in alignment with said applied force to thereby provide a continuous electrically conductive path through the film for forming an electrical interconnect between the electrical components.

6. A directionally conductive polymeric film according to claim 5 in which the first and second resinous materials are soluble in a common solvent, and in which the solvent-soluble first resinous material is reduced in solubility in response to applied heat and pressure to cause said collapse or coalescence of the metal particles to thereby increase the electrical conductivity directionally through the film.

7. A directionally conductive polymeric film according to claim 6 in which the resinous material and its solvent have a positive partial molar volume.

8. A directionally conductive polymeric film according to claim 1 in which the globules have a diameter from about 1 to 20 microns.

9. A directionally conductive polymeric film according to claim 5 in which the globules have a diameter from about 1 to about 20 microns.

10. A directionally conductive polymeric film according to claim 5 in which the globules have a diameter from about 1 to about 20 microns.

11. A directionally conductive polymeric film according to claim 1 in which the metal is selected from the group consisting of copper, nickel, gold, silver, and palladium.

12. A directionally conductive polymeric film according to claim 4 in which the metal is selected from the group consisting of copper, nickel, gold, silver and palladium.

13. A directionally conductive polymeric film according to claim 5 in which the metal is selected from the group consisting of copper, nickel, gold, silver and palladium.

* * * * *

UNITED STATES PATENT AND TRADEMARK OFFICE
CERTIFICATE OF CORRECTION

PATENT NO. : 5,213,715
DATED : May 25, 1993
INVENTOR(S) : Timothy P. Patterson; Carl E. Hoge It is certified that error appears in the above-indentified patent and that said Letters Patent is hereby corrected as shown below:

On the Title Page:

Abstract, line 2, change "terminal" to -- terminals --.

Column 1, line 23, change "packagas" to -- packages --.
Column 1, line 34, change "beer" to -- been --.
Column 1, line 53, change "provides" to -- provided --.

Column 2, line 51, change "arts" to -- acts --.
Column 2, line 51, before "a wetting" insert -- as --.

Column 5, line 8, before "interface" change "in" to -- an --.
Column 5, line 31, before "increase" delete "in".

Column 6, line 4, change "Principle" to -- principle --.
Column 6, line 39, after "component" change ",a)" to -- (a) --.

Column 7, line 31, change "form" to -- from --.

Column 8, line 43, before "connected" insert -- be --.

Column 9, line 43, before "positive" change "in" to -- is --.

Column 10, line 52, change "applied" to -- apply --.

UNITED STATES PATENT AND TRADEMARK OFFICE
CERTIFICATE OF CORRECTION

PATENT NO. : 5,213,715
DATED : May 25, 1993
INVENTOR(S) : Timothy P. Patterson; Carl E. Hoge It is certified that error appears in the above-indentified patent and that said Letters Patent is hereby corrected as shown below:

Column 11, line 6, before "electrical" change "a" to
    -- an --.

Column 11, line 48, change "from" to -- form --.
Column 11, lines 60,61, change "component" to
    -- components --.
Column 11, line 64, after "region" change "provided" to
    -- providing --.

Signed and Sealed this

Nineteenth Day of April, 1994

*Attest:*

BRUCE LEHMAN

*Attesting Officer*  *Commissioner of Patents and Trademarks*